United States Patent
Srivastava et al.

(10) Patent No.: US 9,496,052 B2
(45) Date of Patent: Nov. 15, 2016

(54) SYSTEM AND METHOD FOR HANDLING MEMORY REPAIR DATA

(71) Applicants: Ankush Srivastava, Faridabad (IN); Reinaldo Silveira, Sao Paulo (BR)

(72) Inventors: Ankush Srivastava, Faridabad (IN); Reinaldo Silveira, Sao Paulo (BR)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 104 days.

(21) Appl. No.: 14/568,091

(22) Filed: Dec. 11, 2014

(65) Prior Publication Data

US 2016/0172058 A1    Jun. 16, 2016

(51) Int. Cl.
| | |
|---|---|
| G11C 29/44 | (2006.01) |
| G11C 29/00 | (2006.01) |
| G11C 15/00 | (2006.01) |

(52) U.S. Cl.
CPC ........... *G11C 29/4401* (2013.01); *G11C 29/70* (2013.01); *G11C 29/802* (2013.01); *G11C 15/00* (2013.01); *G11C 29/44* (2013.01); *G11C 2029/4402* (2013.01)

(58) Field of Classification Search
CPC . G11C 29/4401; G11C 16/102; G11C 15/00; G11C 29/70; G11C 29/44; G11C 2029/4402; G11C 2229/76; G11C 2229/72; G11C 29/789; G11C 29/802
USPC .................................................. 714/710, 723
See application file for complete search history.

(56) References Cited

U.S. PATENT DOCUMENTS

| | | | |
|---|---|---|---|
| 5,150,044 A | 9/1992 | Hashizume | |
| 5,448,575 A | 9/1995 | Hashizume | |
| 5,615,217 A | 3/1997 | Horne | |
| 5,987,632 A | 11/1999 | Irrinki et al. | |
| 6,587,981 B1 | 7/2003 | Muradali | |
| 7,234,090 B2 | 6/2007 | Blasi et al. | |
| 7,237,154 B1 | 6/2007 | Zorian | |
| 7,246,282 B2 | 7/2007 | Chau | |
| 7,350,119 B1 * | 3/2008 | Zuraski, Jr. ......... | G06F 12/0802 365/201 |
| 7,519,883 B1 | 4/2009 | Daugherty | |
| 7,650,548 B2 | 1/2010 | Block | |
| 7,657,854 B2 | 2/2010 | Goel et al. | |
| 7,761,755 B1 | 7/2010 | Payakapan et al. | |
| 7,898,882 B2 | 3/2011 | Darbinyan et al. | |
| 7,958,472 B2 | 6/2011 | Wohl et al. | |
| 8,281,190 B2 * | 10/2012 | Gunderson ............. | G06F 11/27 714/30 |
| 8,295,108 B2 | 10/2012 | Darbinyan et al. | |
| 8,495,436 B1 | 7/2013 | Agrawal et al. | |
| 2002/0075740 A1 | 6/2002 | Sung | |

(Continued)

OTHER PUBLICATIONS

V. Sargsyan, "An efficient signature loading mechanism for memory repair," Design & Test Symposium (EWDTS), 2014 East-West, Kiev, 2014, pp. 1-4.*

(Continued)

*Primary Examiner* — Cynthia Britt
(74) *Attorney, Agent, or Firm* — Charles E. Bergere

(57) ABSTRACT

In a system on chip (SOC) device, continuity of a memory repair signature chain, which is accessible by all enabled memory systems, is provided, even when certain memory systems are gated (off) for certain SOC configurations. A mechanism for converting between compressed and uncompressed memory repair data within the repair chain is provided so that memory systems that support either uncompressed memory repair data (such as ternary content addressable memories) or compressed memory repair data can be incorporated in the SOC.

8 Claims, 5 Drawing Sheets

(56) References Cited

U.S. PATENT DOCUMENTS

| | | | | |
|---|---|---|---|---|
| 2002/0101777 | A1* | 8/2002 | Anand | G11C 29/802 |
| | | | | 365/225.7 |
| 2004/0066695 | A1* | 4/2004 | Anand | G11C 29/027 |
| | | | | 365/225.7 |
| 2005/0177695 | A1* | 8/2005 | Larson | G06F 13/161 |
| | | | | 711/167 |
| 2008/0065929 | A1* | 3/2008 | Nadeau-Dostie | G11C 29/4401 |
| | | | | 714/5.11 |
| 2010/0332177 | A1 | 12/2010 | Wu | |
| 2012/0072797 | A1 | 3/2012 | Devta-Prasanna | |

OTHER PUBLICATIONS

C. Banupriya and S. Chandrakala, "A low power Built in Self Repair technique for word oriented memories," Electronics and Communication Systems (ICECS), 2014 International Conference on, Coimbatore, 2014, pp. 1-5.*

* cited by examiner

SYSTEM AND METHOD FOR HANDLING MEMORY REPAIR DATA

BACKGROUND OF THE INVENTION

The present invention relates generally to integrated circuits and, more particularly, to a system and method for handling memory repair data in an integrated circuit having a plurality of memory systems.

Random defects occurring during the manufacturing of an integrated circuit can render certain components, such as a memory row or column, defective. To mitigate these defects, redundant rows and columns are provided to replace defective rows or columns discovered during initial testing. A test procedure typically generates repair data, sometimes referred to as a memory repair signature. The repair data is a binary coded sequence that identifies the detected defective components and the replacement redundant components. In one known memory testing operation, an on-chip built-in-self-test (BIST) engine is provided for testing memory locations within a memory block and for generating the memory repair data. Additionally, each memory block has a corresponding repair register that stores the generated memory repair data. Some BIST engines compress the repair data in order to save on storage space. Repair data is subsequently sent to a fuse processor that permanently burns the repair data in an on-chip fuse storage device such as an OTPROM (One Time Programmable Read Only Memory). When the integrated circuit is subsequently turned on, a fuse processor fetches the repair data from the fuse storage device and provides it to the corresponding memory block such that a faulty memory location is prevented from being used during memory read/write operations.

An integrated circuit device, particularly a "System on Chip" device, which typically has many functional modules may also include a plurality of memory blocks. Some of these memory blocks may support compressed repair data and some may not. For example, a Ternary Content Addressable Memory (TCAM) can only understand uncompressed repair data and so is incompatible with designs that support compressed repair data, where the repair signature registers are connected in a serial, chained fashion. Storage of uncompressed data rather than compressed data, disadvantageously, requires a larger fuse box (OTPROM). A further problem is that TCAM repair data is shifted to and from its associated repair register in a serial fashion, rather than in parallel as with other memory types, such as a compiled memory.

A single SOC may have several selectable "personalities" whereby it may be programmed to perform different functions by switching on or off one or more functional modules which, in turn, may include any combination of memory modules supporting or not supporting compressed repair data. Thus it would be advantageous to provide an integrated circuit in which different types of memory can co-exist and exhibit compatibility with a fuse box configured to store compressed repair data.

BRIEF DESCRIPTION OF THE DRAWINGS

The invention, together with objects and advantages thereof, may best be understood by reference to the following description of preferred embodiments together with the accompanying drawings in which.

DETAILED DESCRIPTION OF PREFERRED EMBODIMENTS

Figure 1:
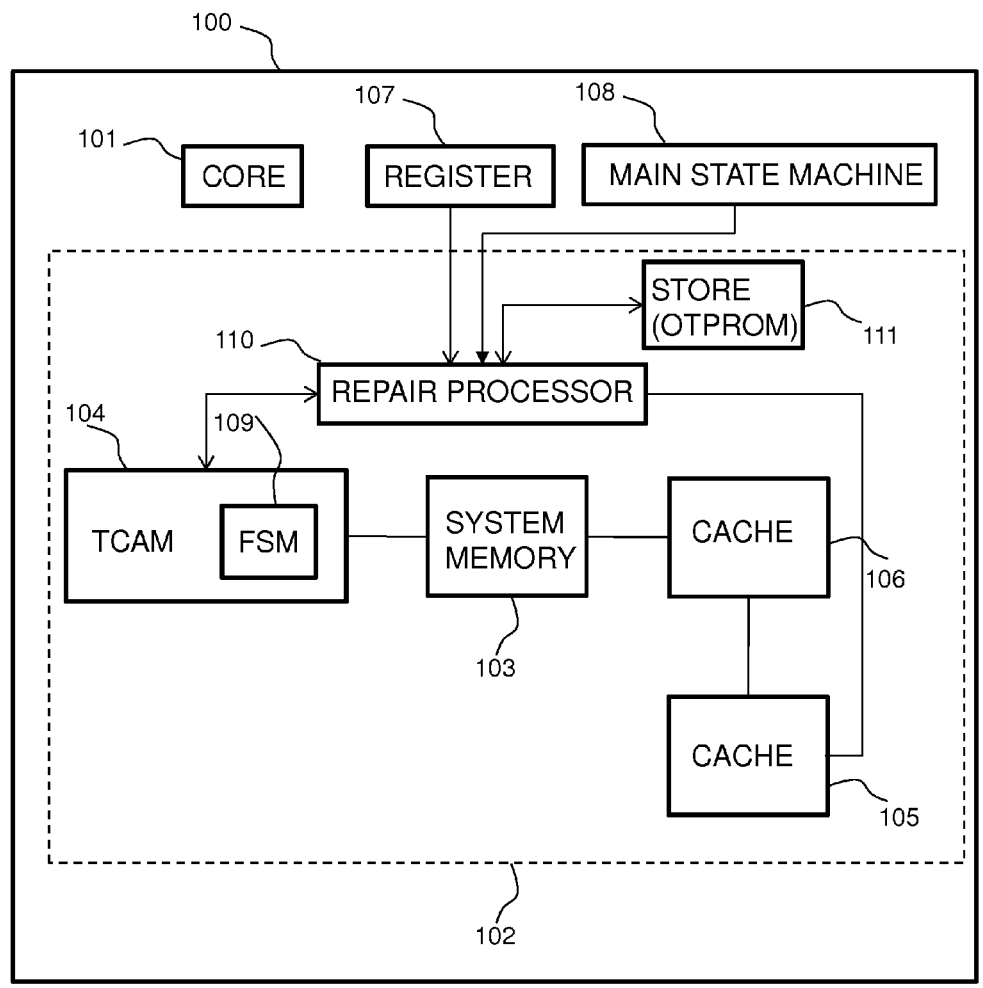
FIG. 1 is a simplified block diagram of a integrated circuit configured to operate in accordance with an embodiment of the invention.

The detailed description set forth below in connection with the appended drawings is intended as a description of presently preferred embodiments of the invention, and is not intended to represent the only forms in which the present invention may be practised. It is to be understood that the same or equivalent functions may be accomplished by different embodiments that are intended to be encompassed within the spirit and scope of the invention. In the drawings, like numerals are used to indicate like elements throughout. Furthermore, terms "comprises," "comprising," or any other variation thereof, are intended to cover a non-exclusive inclusion, such that module, circuit, device components, structures and method steps that comprises a list of elements or steps does not include only those elements but may include other elements or steps not expressly listed or inherent to such module, circuit, device components or steps. An element or step proceeded by "comprises . . . a" does not, without more constraints, preclude the existence of additional identical elements or steps that comprises the element or step.

In one embodiment, the present invention provides an integrated circuit comprising first and second memory systems wherein each memory system includes a memory module and an associated first repair register for receiving compressed memory repair data. The first repair registers are serially connected as a chain. The integrated circuit further comprises a store for storing compressed repair data for each memory module, a processor operably coupled to the store and to the first repair registers and arranged to fetch compressed repair data from the store and to shift the fetched compressed repair data through the chain for reception by the first repair registers. The first memory system also includes a second repair register and a decoder, operably coupled between the second repair register and the first repair register associated with the first memory module, and the first memory system is arranged to shift compressed repair data for the first memory module from the first repair register through the decoder to the second repair register for storage therein as decompressed repair data.

In another embodiment, the present invention provides a method for processing repair data in an integrated circuit, where the integrated circuit comprises first and second memory systems wherein each memory system includes a memory module and an associated first repair register for receiving compressed memory repair data, and wherein the first repair registers are serially connected in a chain, and wherein the first memory system includes a second repair register and a decoder, the method comprising: fetching compressed memory repair data from a store; shifting the fetched compressed memory repair data through the chain to each first repair register; and in the first memory system, decompressing memory repair data received at the associated first repair register, and shifting decompressed memory repair data into a second repair register for use by the memory module of the first memory system.

Referring now to FIG. 1, an integrated circuit 100, which in this example is a system on chip (SOC), is shown. The SOC 100 includes a plurality of functional modules only a few examples thereof being shown in FIG. 1. The SOC 100 comprises a microprocessor core 101 and a memory block 102. The memory block 102 includes a system memory 103, a TCAM 104, and two cache memories 105, 106. A register 107 and a main state machine 108 are operably coupled to the memory block 102. The TCAM 104 includes a finite state machine 109. The memories 103, 104, 105, 106 are linked in a chain via a repair processor 110. The repair processor 110 is operably coupled to a store 111, which in this example is an OTPROM. The SOC 100 has "multiple personalities" whereby certain functional modules may be operational and other functional modules may be disabled, gated or turned off. Thus, depending on how the SOC 100 is to be used, one or more of the memories 103-106 may be gated, turned off or disabled. The repair processor 110 is operable to gate one or more of the memories 103-106 in accordance with a configuration received from the OTPROM 111 or, in one alternative embodiment, from the register 107, which is software-controlled.

Figure 2:
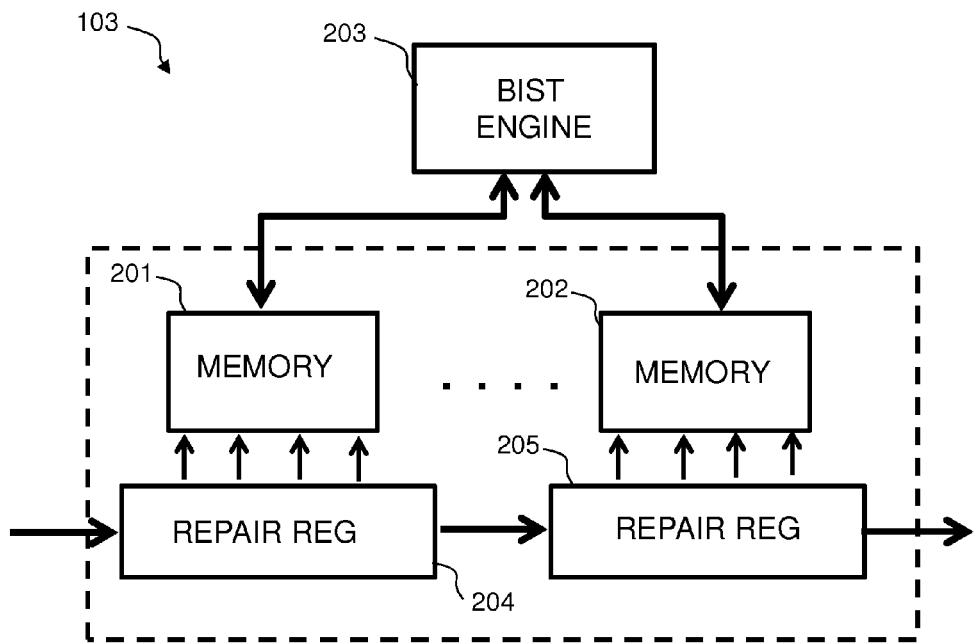
FIG. 2 is a simplified block diagram of a memory system including at least one compiled memory and included in the integrated circuit of FIG. 1.

The system memory 103 of FIG. 1 will now be described in greater detail with reference to FIG. 2. The system memory 103 comprises one or more compiled memory modules, two of which 201, 202 are shown. Both of the memory modules 201, 202 are operably coupled to a BIST engine 203. The BIST engine 203 has the capability of testing each of the memory modules 201, 202 and generating memory repair data for each module 201, 202 in compressed form. Each memory module 201, 202 has associated therewith a repair register. Two repair registers 204, 205 are shown, where the repair register 204 is associated with the memory module 201 and the repair register 205 is associated with the memory module 202. Each repair register 204, 205 stores the BIST generated compressed repair data relating to its associated memory 201, 202. The repair registers 204, 205 are connected in series, as a chain, such that compressed repair data may be shifted into and out of the memory 103 in a serial fashion. The compressed repair data stored in the repair registers 204, 205 is transferred between the repair register 204, 205 and its associated memory 201, 202 in a parallel fashion.

Figure 3:
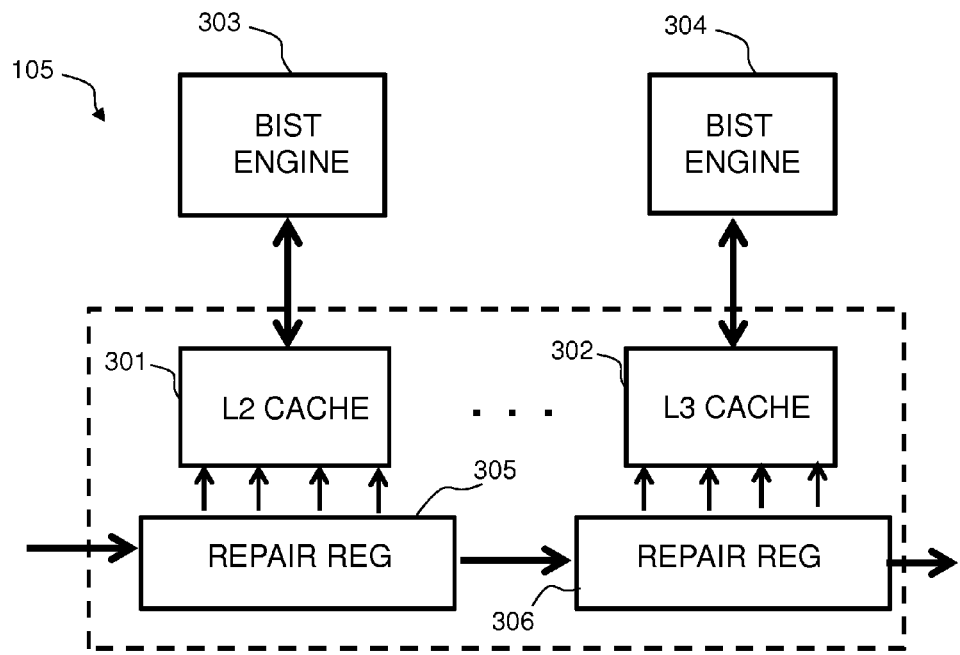
FIG. 3 is a simplified block diagram of a cache memory system of the integrated circuit of FIG. 1.

Referring now to FIG. 3, the cache memory 105 (or 106) of FIG. 1 will now be described. The cache memory 105 comprises one or more cache memory modules, two of which 301, 302 are shown in FIG. 3. In this example, the first cache memory module 301 is a level 2 (L2) cache and the second cache memory module 302 is a level 3 (L3) cache. Each of the cache memory modules 301, 302 is operably coupled with an associated BIST engine 303, 304. In FIG. 3, the BIST engine 303 is associated with the L2 cache 301 and the BIST engine 304 is associated with the L3 cache 302. Each of the BIST engines 303, 304 has the capability of testing its associated memory module 301, 302 and generating memory repair data therefor in compressed form, which is then stored in an associated repair register 305, 306. The repair registers 305, 306 are connected in series to form a chained connection, whereby compressed repair data may be shifted into and out of the cache memory 105 in a serial fashion. Repair data is transferred between the repair registers 305, 306 and their associated memories 301, 302 in a parallel fashion. The cache memory 106 of FIG. 1 may have a similar construction to the cache memory 105 shown in FIG. 3.

Figure 4:
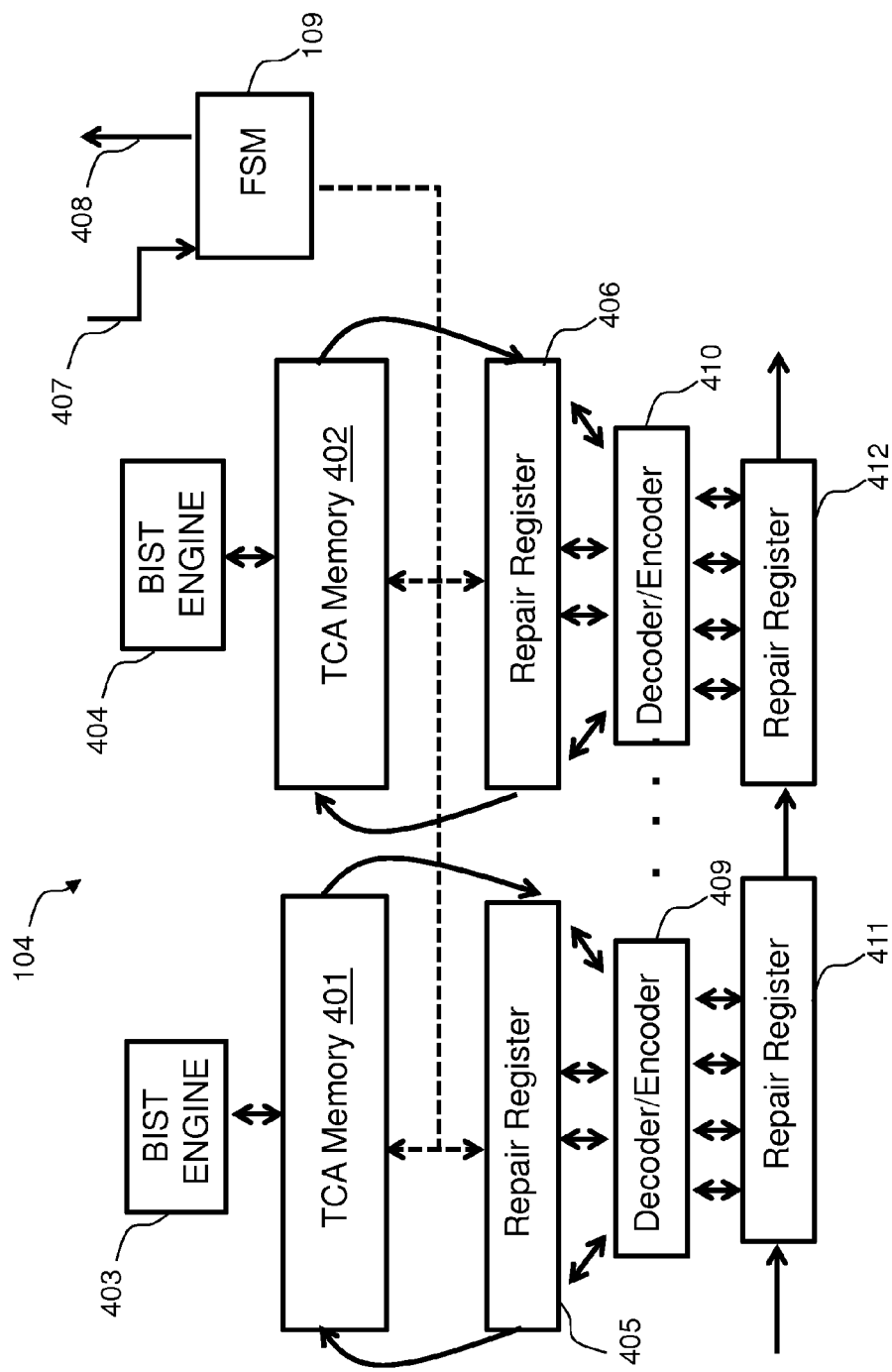
FIG. 4 is a schematic block diagram of a memory system including a TCAM and included in the integrated circuit of FIG. 1.

The TCAM 104 of FIG. 1 will now be described with reference to FIG. 4. The TCAM 104 comprises one or more TCA memories two of which 401, 402 are shown in FIG. 4. Each TCA memory 401, 402 is operably coupled to an associated BIST engine 403, 404, where BIST engine 403 is associated with the TCA memory 401 and BIST engine 404 is associated with the TCA memory 402. The BIST engines 403, 404 are for testing the TCA memories 401, 402 and generating uncompressed memory repair data therefor. Each of the TCA memories 401, 402 also has associated therewith a first type repair register 405, 406, wherein the first type repair register 405 is associated with and operably coupled to the TCA memory 401 and the first type repair register 406 is associated with and operably coupled to TCA memory 402. Each first type repair register 405, 406 stores the generated uncompressed repair data relating to its associated memory 401, 402. The uncompressed repair data is transferred between a TCA memory and its associated first type repair register in a serial fashion and under the control of the TCAM finite state machine 109, which is operably coupled to each of the first type repair registers 405, 406 and to the TCA memories 401, 402. The finite state machine (FSM) 109 receives an instruction on line 407 from the repair processor 110 to commence shifting uncompressed repair data between a TCA memory 401, 402 and its associated first type repair register 405, 406. The FSM 109 generates a signal on line 408 that is applied to the repair processor 110 for confirming that a shift operation has been completed. Each of the first type repair registers 405, 406 also is operably coupled to an associated decoder/encoder block 409, 410, respectively. Each decoder/encoder block 409, 410 is operably coupled to an associated second type repair register 411, 412, respectively. Each of the second type repair registers 411, 412 stores compressed repair data relating to its associated TCA memory 401, 402. Thus, the second type repair register 411 stores compressed repair data relating to the TCA memory 401 and the second type repair register 412 stores compressed repair data relating to the TCA memory 402. Uncompressed repair data is shifted out of the first type repair register in parallel form into the associated decoder/encoder block, converted to compressed form by the encoding functionality of the decoder/encoder block and transferred to an associated second type repair register as compressed repair data. Similarly, compressed repair data held in the second type repair registers is shifted in a parallel fashion into the decoder/encoder block and converted to uncompressed repair data by a decoding function of the decoder/encoder block and subsequently shifted into the first type repair register as uncompressed data in a parallel fashion. Shifting of data between the first and second type registers via the decoder/encoder blocks is also controlled by the FSM 109. Each of the decoder/encoder blocks 409, 410 may be of a conventional design for compressing and decompressing data. The second type repair registers 411, 412 are connected in a chained fashion to form a chained connection whereby compressed repair data may be shifted into and out of the TCAM 104 in a serial fashion.

In one example of operation of the SOC 100, in a memory testing operation, each of the BIST engines 203, 303-304, and 403-404 associated with each of the memories 103, 104, 105, 106 performs memory testing of its associated memory in accordance with conventional techniques. In the case of the TCAM 104, the associated BIST engines 403-404 generate uncompressed repair data that is serially shifted into and stored in the first type repair registers 405-406. This is done under the control of the FSM 109. Subsequently, and also under the control of the FSM 109, the uncompressed repair data is compressed and shifted into and stored in the second type repair registers 411, 412 by the decoder/encoder blocks 409, 410. All of the repair registers associated with the system memory 103 and the cache memories 105, 106 and the second type repair registers 411, 412 of the TCAM 104 are linked in a chain and connected across the repair processor 110. In response to an instruction from the main state machine 108, the repair processor 110 initiates and controls serial shifting of the contents of the linked repair registers into the OTPROM 111 for permanent storage. As all of the repair data shifted into the OTPROM 111 is compressed, this reduces the demands on the storage capacity of the OTPROM 111.

Figure 5:
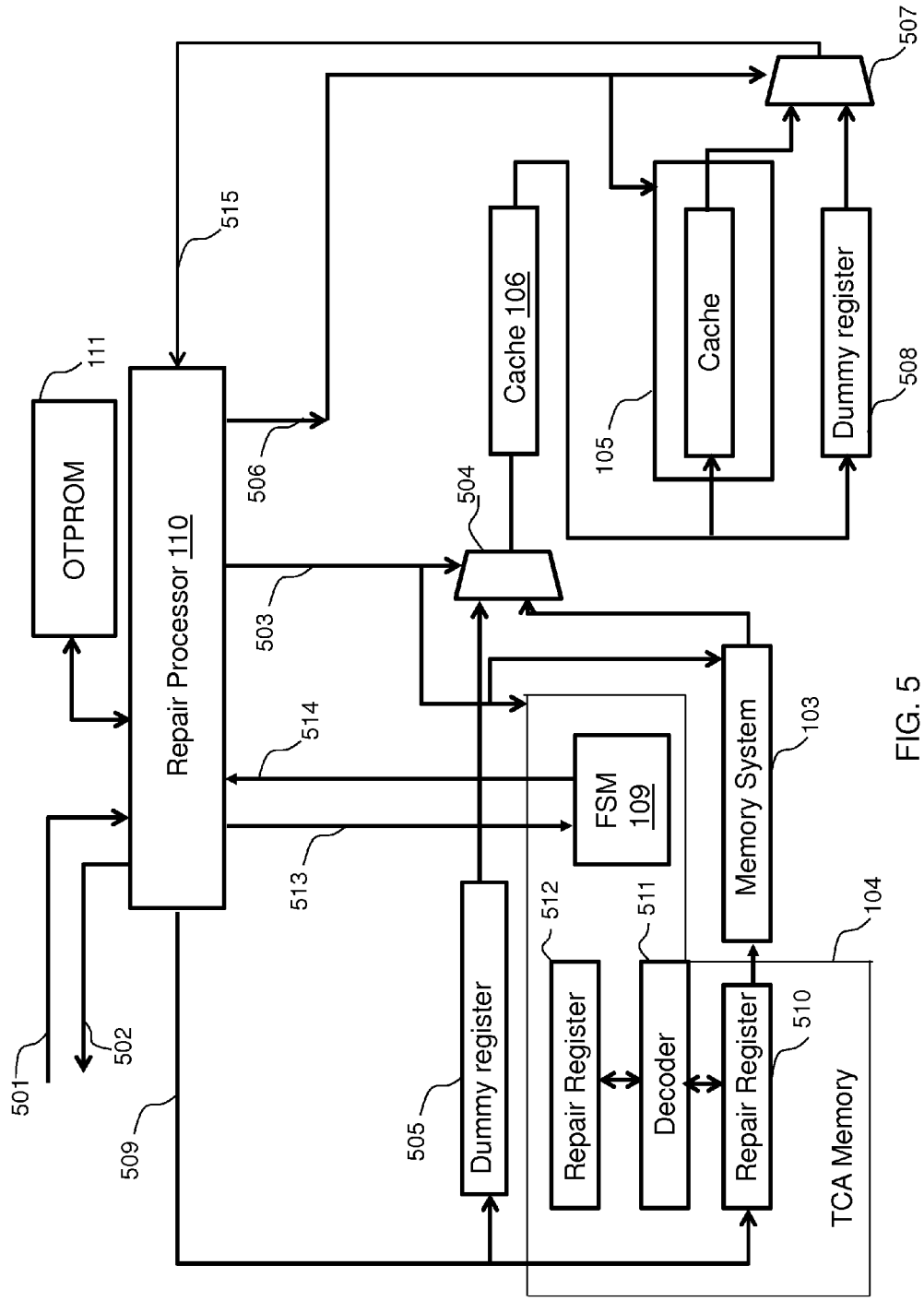
FIG. 5 is a schematic block diagram of a portion of the integrated circuit of FIG. 1.

A further example of operation will now be described with reference to FIG. 5, which illustrates in greater detail certain components comprising the memory block 102. The repair processor 110 receives an instruction on line 501 from the main state machine 108 (see FIG. 1) to start a shift operation. The repair processor 110 generates a signal on output line 502 after completion of repair data shifting, indicating that all shifting has been done. The repair processor 110 is operably coupled to the OTPROM 111. The OTPROM 111 stores compressed memory repair data for all of the memories 103-106 that resulted from memory testing operations performed by the associated BIST engines as described above. The OTPROM 111 also has stored therein a configuration of the SOC 100 that is used to determine which memory systems included in the memory block 102 are to be enabled and which are to be gated. A first gate/enable output of the repair processor 110 on line 503 is received by the TCAM 104 and the system memory 103 and at a select input of a first multiplexer 504. A first dummy register 505 has an output that serves as a first data input to the first multiplexer 504. The first dummy register 505 is connected in parallel with the TCAM 104. An output from the TCAM 104 is connected to the system memory 103, which in turn has an output that serves as a second data input to the first multiplexer 504. Both the first dummy register 505 and the TCAM 104 receive compressed repair data from an output of the repair processor 110 on a line 509. A second gate enable signal output by the repair processor 110 on line 506 is fed to a select input of a second multiplexer 507 and to one of the cache memories 105. An output from the cache memory 105 and an output from a second dummy register 508, connected in parallel with the cache memory 105, provide data inputs to the second multiplexer 507. Inputs to the cache memory 105 and to the second dummy register 508 are provided by an output of the other cache memory 106. An input of the cache memory 106 is operably coupled to an output of the first multiplexer 504 and an input of the repair processor 110 is operably coupled to an output of the second multiplexer 507.

The repair registers of the system memory 103, both cache memories 105, 106 and the second type repair registers 411, 412 of the TCAM 104 are linked (in some cases through other components) in a chain so that repair data that is output by the repair processor 110 can be shifted in a serial fashion through the chained repair registers and back to the repair processor 110. Each memory block within each memory system is provided with a facility for knowing which bits of the serial stream of compressed data are relevant to that particular memory block and for extracting the identified relevant bits from the stream. This facility can be provided by conventional means. The shifting of (compressed) repair data is done under the control of the repair processor 110 in response to a signal received on line 501 from the main state machine 108. When a shifting operation has been completed, the repair processor 110 generates a signal on line 502 that is applied to the main state machine 108 indicating that the shift process has been completed.

In an example of operation, explained with reference to FIG. 5, in order for each memory block within each memory system to receive its repair data, the repair processor 110 fetches the repair data from the OTPROM 111 and shifts it, in a first shifting process, in serial fashion, from its output on line 509 where it is received by a second type repair register 510 (e.g., repair registers 411, 412 of FIG. 4) of the TCAM 104 and the first dummy register 505. As the repair data arriving at the TCAM 104 is in compressed form, it must be decompressed before the TCAM memories (401, 402) can make use of the repair data. Therefore, compressed data received by the second type repair register 510 is decompressed by an associated decoder 511 and output to a first type repair register 512 (e.g., repair registers 405, 406 of FIG. 4) in uncompressed form. The decompression operation and the shifting of repair data from the second type repair register 510 through the decoder 511 to the repair register 512 is performed as a secondary shifting process and under the control of the FSM 109 in response to an instruction received from the repair processor on line 513. Once all the appropriate repair data has been decoded and transferred to the first type repair register 512, the FSM 109 generates a signal on line 514 that it sent to the repair processor 110 to signal the repair processor 110 that this secondary shifting process has been completed. The first shifting process also transfers the (serial, compressed) repair data from the TCAM 104 to the system memory 103. The system memory 103 is able to extract and use the relevant bits of compressed repair data from the received serial stream of repair data in a conventional manner. The primary shifting process then continues by transferring the repair data onward through the first multiplexer 504 to the cache memory 106. The cache memory 106 extracts and uses the relevant bits of compressed repair data from the received serial stream of repair data in a conventional manner. The first shifting process then continues by transferring the repair data onward to the cache memory 105 and the second dummy register 508. The cache memory 105 extracts and uses the relevant bits of compressed repair data from the received serial stream of repair data in a conventional manner. The first shifting process then continues by transferring the repair data onward through the second multiplexer 507 back to the repair processor 110. When the repair processor 110 detects that the first shifting process has been completed, it notifies the FSM 109 by generating a signal on line 513 that signifies to the FSM 109 that a second shifting process can be started in the TCAM 104.

Figure 6:
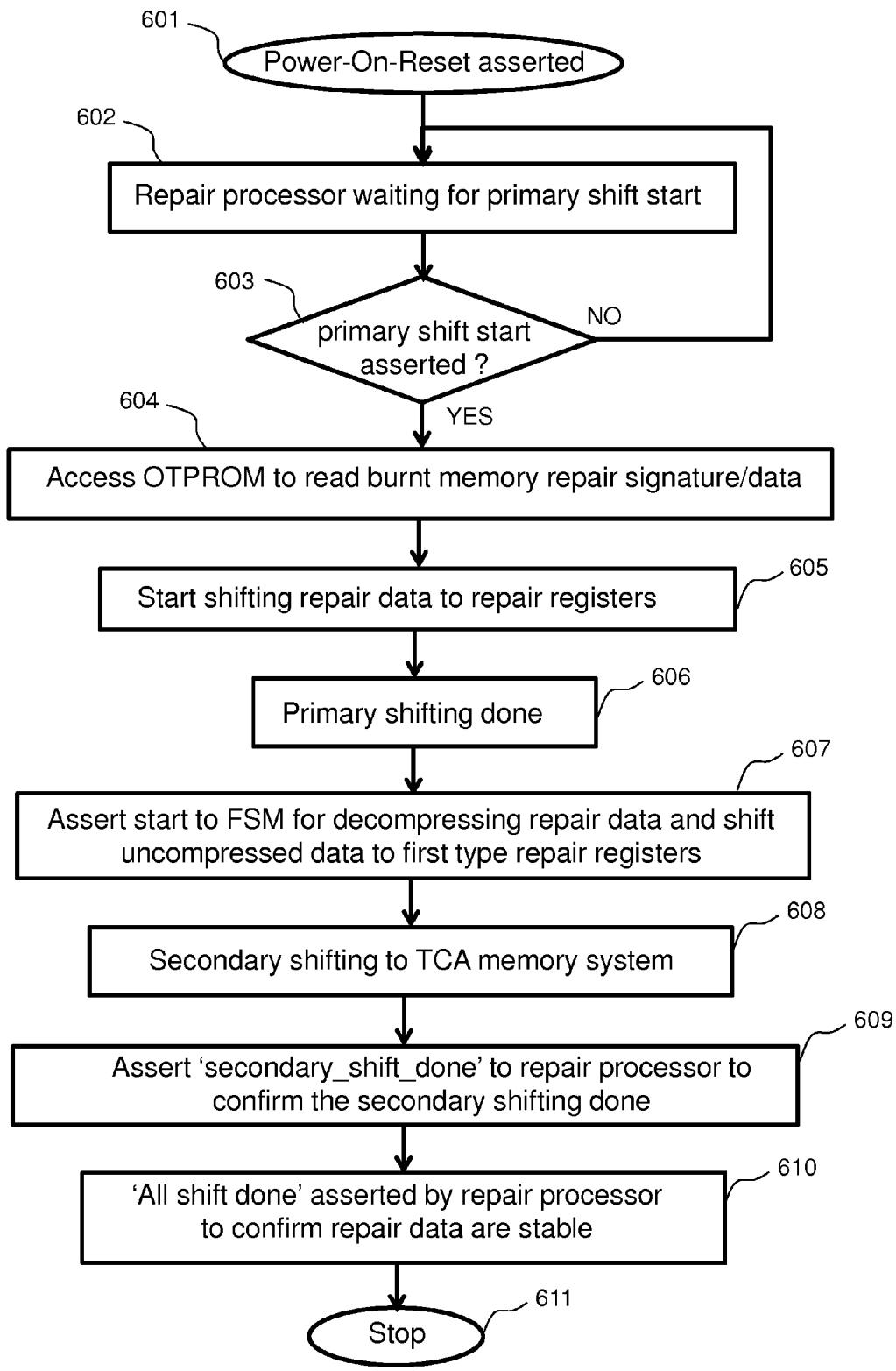
FIG. 6 is a flow chart of a method of operation of the SOC of FIG. 1 in accordance with an embodiment of the present invention.

A further example of operation of the memory block of FIG. 5 will now be described with reference to the flow chart of FIG. 6. At 601 a power-on reset instruction for the SOC 100 is asserted. At 602, the repair processor 110 waits for a "primary shift start" instruction from the main state machine 108. If at 603 it is determined that a "primary shift start" instruction has been asserted then at 604, the repair processor 110 accesses the OTPROM 111 to read the burnt memory repair signature. At 605, repair data is shifted into the second type repair registers 411, 412 of the TCAM 104 and to the repair registers of other memory systems that support compressed data. At 606 the primary shifting process is complete. At 607, an assert signal is sent from the repair processor 110 to the FSM 109 for commencing the decompression of repair data and shifting the resulting uncompressed repair data into the first type repair registers 405, 406. At 608 the secondary shifting process continues by shifting uncompressed data into the TCAM memories 401, 402. At 609, a "secondary shifting done" signal is asserted by the FSM 109 to the repair processor 110 to confirm that the secondary shifting is complete. At 610 the repair processor 110 notifies the main state machine 108 that primary and secondary shifting processes have been completed and therefore all repair data is stable. At 611 the method terminates.

A further example of operation of the memory block of FIG. 5 will be described referring once again to both FIG. 5 and FIG. 1. In this example, the SOC 100 is configured so that certain memory systems are enabled while others are gated or disabled. Consider the case where both the TCAM 104 and the system memory 103 receive a disable signal on line 503 from the repair processor 110 and the cache memory 105 receives an enable signal on line 506 from the repair processor 110. Thus, the TCAM 104 and the system memory 103 are not required in this configuration and only the cache memories 105 and 106 are active. The disable signal on line 503 is also applied to the select input of the first multiplexer 504 and causes the first multiplexer 504 to select the output of the first dummy register 505 rather than the output from the system memory 103. Hence the repair data, output on line 509 from the repair processor 110, reaches the (always active) cache memory system 106 via the first dummy register 505 and by the action of the first multiplexer 504. Similarly, the enable signal on line 506 from the repair processor 110 is received at the select input of the second multiplexer 507, which causes the second multiplexer 507 to select the output of the enabled cache memory 105 for onward transmission back to the repair processor 110 on line 515. In an alternative embodiment where the cache memory 105 is disabled, then the select input of the second multiplexer 507 causes the second multiplexer 507 to select the output from the second dummy register 508 instead. The cache memory 105 receives an enable signal on line 506 from the repair processor 110. Thus, the TCAM 104 and the system memory 103 are not required in this configuration and only the cache memories 105 and 106 are active. The disable signal on line 503 is also applied to the select input of the first multiplexer 504 and causes the first multiplexer 504 to select the output of the first dummy register 505 rather than the output from the system memory 103. Hence the repair data, output on line 509 from the repair processor 110, reaches the (always active) cache memory system 106 via the first dummy register 505 and by the action of the first multiplexer 504. Similarly, the enable signal on line 506 from the repair processor 110 is received at the select input of the second multiplexer 507, which causes the second multiplexer 507 to select the output of the enabled cache memory 105 for onward transmission back to the repair processor 110 on line 515. In an alternative embodiment where the cache memory 105 is disabled, then the select input of the second multiplexer 507 causes the second multiplexer 507 to select the output from the second dummy register 508 instead.

Advantageously, even when certain SOC memory systems are gated, the invention enables continuity of a memory repair signature chain, which is accessible by all enabled memory systems.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediate components. Likewise, any two components so associated can also be viewed as being "operably connected," or "operably coupled," to each other to achieve the desired functionality.

Furthermore, those skilled in the art will recognize that boundaries between the above described operations are merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also, for example, in one embodiment, the illustrated examples may be implemented as circuitry located on a single integrated circuit or within a same device. Furthermore, the entire functionality of the modules shown in FIG. 1 may be implemented in an integrated circuit. Such an integrated circuit may be a package containing one or more dies. Alternatively, the examples may be implemented as any number of separate integrated circuits or separate devices interconnected with each other in a suitable manner. An integrated circuit device may comprise one or more dies in a single package with electronic components provided on the dies that form the modules and which are connectable to other components outside the package through suitable connections such as pins of the package and bond wires between the pins and the dies.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as "computer systems."

The description of the preferred embodiments of the present invention has been presented for purposes of illustration and description, but is not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiment disclosed, but covers modifications within the spirit and scope of the present invention as defined by the appended claims.

The invention claimed is:

1. An integrated circuit, comprising:
    first and second memory systems, wherein each memory system includes a memory module having an associated first repair register for receiving compressed memory repair data, and wherein the first repair registers are connected in series as a chain;
    a store for storing compressed memory repair data for the first and second memory modules; and
    a processor, operably coupled to the store, for fetching the compressed memory repair data from the store and shifting the fetched compressed memory repair data through the chain for reception by the first repair registers,
    wherein each memory system includes a second repair register and a decoder, wherein each of the respective decoders is operably coupled between the respective second repair register and the respective first repair register of the memory systems, and
    wherein each memory system shifts compressed memory repair data for its memory module from the first repair register thereof through the decoder to the second repair register thereof for storage therein as decompressed memory repair data.

2. The integrated circuit of claim 1, wherein the first memory system includes a state machine for shifting compressed memory repair data for its memory module from the first repair register through the decoder to the second repair register for storage therein.

3. The integrated circuit of claim 1, wherein the store is a one-time programmable read-only memory (OTPROM).

4. The integrated circuit of claim 1, wherein the memory module of the first memory system is a ternary content addressable memory (TCAM).

5. The integrated circuit of claim 4, wherein the memory module of the second memory system is a cache.

6. The integrated circuit of claim 1, wherein:
    each memory system includes a built-in self-test (BIST) engine for generating memory repair data associated with its memory module, and
    the first memory system includes an encoder operably coupled between the first repair register thereof and the second repair register thereof, and arranged to shift uncompressed repair data generated by the BIST engine from the second repair register thereof through the encoder to the first repair register thereof for storage therein as compressed memory repair data.

7. The integrated circuit of claim 6, wherein the first memory system includes a state machine for shifting uncompressed repair data from the second repair register thereof through the encoder to the first repair register thereof for storage therein as compressed repair data.

8. The integrated circuit of claim 1, wherein:
    the processor disables at least one of the first and second memory systems depending on a pre-determined configuration of the integrated circuit; and
    the integrated circuit includes:
        at least one dummy register operably coupled to the processor for receiving memory repair data and connected in parallel across one of the first and second memory systems; and
        a selector for receiving a control signal from the processor and selecting one of an output of a dummy register and an output of the connected memory system depending on the pre-determined configuration of the integrated circuit.

* * * * *